US009923528B2

(12) United States Patent
Marcone (10) Patent No.: US 9,923,528 B2
(45) Date of Patent: Mar. 20, 2018

(54) ADAPTIVE BOOST SUPPLY WITH SLOPE CONTROL

(71) Applicant: Marvell World Trade Ltd., St. Michael (BB)

(72) Inventor: Bruno Marcone, Mezzanino (IT)

(73) Assignee: Marvell World Trade Ltd., St. Michael (BB)

( * ) Notice: Subject to any disclaimer, the term of this patent is extended or adjusted under 35 U.S.C. 154(b) by 164 days.

(21) Appl. No.: 14/331,132

(22) Filed: Jul. 14, 2014

(65) Prior Publication Data

US 2015/0022265 A1    Jan. 22, 2015

Related U.S. Application Data

(60) Provisional application No. 61/846,813, filed on Jul. 16, 2013.

(51) Int. Cl.
| | | |
|---|---|---|
| *H03F 3/217* | (2006.01) | |
| *H02M 3/156* | (2006.01) | |
| *H02M 1/00* | (2006.01) | |

(52) U.S. Cl.
CPC .......... *H03F 3/217* (2013.01); *H02M 3/156* (2013.01); *H02M 2001/0025* (2013.01); *H02M 2001/0032* (2013.01); *Y02B 70/16* (2013.01)

(58) Field of Classification Search
CPC . H02M 2001/0025; H02M 2001/0032; H02M 3/156; H03F 3/217; Y02B 70/16
USPC ....................................................... 323/271
See application file for complete search history.

(56) References Cited

U.S. PATENT DOCUMENTS

| | | | | |
|---|---|---|---|---|
| 6,294,904 B1* | 9/2001 | Hirst | ...................... | H02M 3/156 323/283 |
| 2008/0170720 A1* | 7/2008 | Rashid | ..................... | H03F 1/305 381/94.5 |
| 2008/0303493 A1* | 12/2008 | Hu | .......................... | H02M 1/36 323/271 |
| 2009/0115392 A1* | 5/2009 | Shimizu | ................ | H02M 3/156 323/283 |
| 2010/0079123 A1* | 4/2010 | Miyamae | .............. | H02M 3/158 323/282 |
| 2011/0175588 A1* | 7/2011 | Miyamae | ............ | H02M 3/1582 323/283 |
| 2012/0032658 A1* | 2/2012 | Casey | ................. | H02M 3/1582 323/271 |
| 2013/0169248 A1* | 7/2013 | Zhang | ................... | H02M 3/158 323/271 |
| 2013/0257399 A1* | 10/2013 | Jiang | ........................ | G05F 1/10 323/271 |

(Continued)

*Primary Examiner* — Adolf Berhane
*Assistant Examiner* — Bart Iliya (57) ABSTRACT

An apparatus includes a first circuit configured to generate a boost voltage, and a second circuit to control a slope of a magnitude of the boost voltage when the magnitude of the boost voltage is reduced. The first circuit is configured to generate the boost voltage having the magnitude equal to a first voltage when a control signal is in a first state, and reduce the magnitude of the boost voltage when the control signal is in a second state and the magnitude of the boost voltage is greater than a second voltage which is less than the first voltage. A method of providing a boost voltage includes controlling a slope of a magnitude of the boost voltage when the magnitude of the boost voltage is decreased.

16 Claims, 5 Drawing Sheets

(56) References Cited

U.S. PATENT DOCUMENTS

| | | | |
|---|---|---|---|
| 2013/0257533 A1* | 10/2013 | Krabbenborg | G05F 5/00 330/251 |
| 2014/0132236 A1* | 5/2014 | Darmawaskita | H02M 3/156 323/283 |
| 2014/0159686 A1* | 6/2014 | Lee | H02M 3/156 323/282 |
| 2014/0239925 A1* | 8/2014 | Tanabe | H02M 3/1582 323/271 |
| 2014/0266109 A1* | 9/2014 | Zhang | H02M 1/15 323/282 |

* cited by examiner

FIG. 6

ADAPTIVE BOOST SUPPLY WITH SLOPE CONTROL

CROSS REFERENCE TO RELATED APPLICATIONS

This present disclosure claims the benefit of U.S. Provisional Application No. 61/846,813, filed on Jul. 16, 2013, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Using energy-efficient circuits in a battery-powered portable electronic device increases a battery life and reduces a heat dissipation requirement of the portable electronic device. Class D amplifiers are energy-efficient amplifiers, and accordingly, the portable electronic device may use a class D amplifier to drive a load such as a speaker.

A class D amplifier operates by rapidly turning one or more switching devices, such as transistors, on and off, with the ratio of the on time to the off time (the duty cycle) being determined by an input signal of the class D amplifier. The switch may be controlled at a frequency much higher than the maximum frequency of the input signal. A low pass filter is connected to the output to of the class D amplifier to remove high frequency components of the output signal, leaving only the amplified input signal.

In a battery-powered device, a voltage boost power supply may be used to produce a boost voltage that remains constant even as the battery voltage changes due to the discharging or charging of the battery. The voltage boost power supply may also be used to supply a voltage higher than the voltage supplied by the battery.

An adaptive boost power supply changes the boost voltage according to a change in operating conditions. For example, an adaptive boost supply may provide a first voltage as a power supply of an amplifier when a power output of the amplifier is low, and a second voltage higher than the first voltage as the power supply of the amplifier when the power output of the amplifier is high. The adaptive boost power supply may determine whether to supply a high boost voltage or a low voltage using one or more input signals to the amplifier.

SUMMARY

In an embodiment, an apparatus includes a first circuit configured to generate a boost voltage, and a second circuit to control a slope of a magnitude of the boost voltage when the magnitude of the boost voltage is reduced.

In an embodiment, the first circuit is configured to generate the boost voltage having the magnitude equal to a first voltage when a control signal is in a first state, and reduce the magnitude of the boost voltage when the control signal is in a second state and the magnitude of the boost voltage is greater than a second voltage. The second voltage is less than the first voltage.

In an embodiment, the apparatus includes a target voltage circuit configured to raise a target voltage to a first voltage without delay when a control signal is in a first state, and to reduce the target voltage to a second voltage in response to the control signal changing from the first state to a second state. The first circuit is configured to determine the magnitude of the boost voltage using the target voltage.

In an embodiment, the apparatus includes a class D amplifier, and the boost voltage is a supply voltage of the class D amplifier.

In an embodiment, the apparatus is a semiconductor chip including an integrated circuit.

In an embodiment of a method of providing a boost voltage, the method includes providing the boost voltage and controlling a slope of a magnitude of the boost voltage when the magnitude of the boost voltage is decreased.

In an embodiment of the method, the boost voltage is provided by a boost circuit, and the method includes providing a boost voltage according to a target voltage, and controlling a slope of a magnitude of the target voltage when the magnitude of the target voltage is reduced.

DETAILED DESCRIPTION

Figure 1:
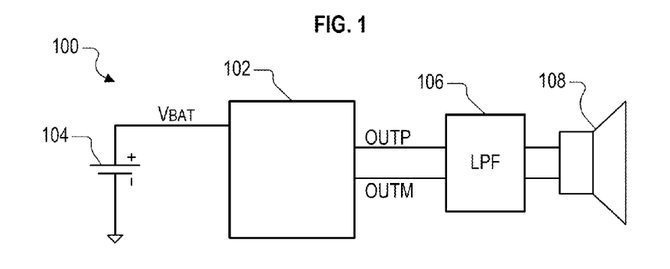
FIG. 1 is a block diagram of a device including an embodiment of the disclosure.

FIG. 1 shows a portable device 100 according to an embodiment. The portable device 100 includes an electronic circuit 102, a battery 104, a low-pass filter (LPF) 106, and a speaker 108. In an embodiment, the circuit 102 includes an integrated circuit (IC) such as a System-On-a-Chip (SOC) or an audio subsystem IC.

The battery 102 supplies battery voltage $V_{BAT}$ to the circuit 102. The circuit 102 generates an audio signal on first and second outputs OUTP and OUTM. The first and second outputs OUTP and OUTM are Pulse-Width Modulated (PWM) signals. In an embodiment, the first and second outputs OUTP and OUTM are differential outputs, but embodiments are not limited thereto.

The LPF 106 attenuates high frequency components of the first and second outputs OUTP and OUTM. The filtered output of the LPF 106 is provided to the speaker 108 to produce sound. While the described embodiment drives the speaker 108 using an audio signal, embodiments are not limited thereto.

Figure 2:
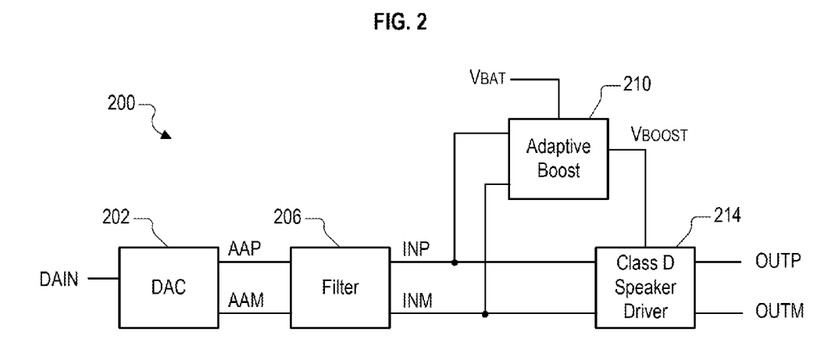
FIG. 2 is a block diagram of an amplifier circuit according to an embodiment.

FIG. 2 is a block diagram of an amplifier circuit 200 suitable for use in the circuit 102 of FIG. 1 to produce the first and second outputs OUTP and OUTM thereof. The amplifier circuit 200 includes a Digital to Audio Converter (DAC) 202, a reconstruction filter 206, a class D speaker driver 214, and an adaptive boost circuit 210.

The DAC 202 receives a digital audio signal DAIN and converts it to first and second analog audio signal AAP and AAM. In an embodiment, the first and second analog audio signal AAP and AAM provide a differential audio signal, but embodiments are not limited thereto.

The reconstruction filter 206 filters the first and second analog audio signals AAP and AAM to produce first and second input signals INP and INM to the speaker driver 214. The speaker driver 214 performs class D amplification of the first and second input signals INP and INM to produce PWM first and second outputs OUTP and OUTM.

The adaptive boost circuit 210 supplies a boost voltage $V_{BOOST}$ to the speaker driver 214. The boost voltage $V_{BOOST}$ is generated from the battery voltage $V_{BAT}$, and varies according to a power output of the speaker driver 214. In an embodiment, the boost voltage $V_{BOOST}$ may be controlled to range from the battery voltage $V_{BAT}$ to a voltage substantially higher than the battery voltage $V_{BAT}$. In another embodiment, the boost voltage $V_{BOOST}$ may vary from a first voltage to a second voltage substantially higher than the first voltage, wherein the first voltage may be higher or lower than the battery voltage $V_{BAT}$.

In an embodiment, the adaptive boost circuit 210 controls the boost voltage $V_{BOOST}$ to be one of a first voltage and a second voltage, the second voltage being substantially higher than the first voltage, but embodiments are not limited thereto. In an embodiment, the first voltage is the current battery voltage $V_{BAT}$.

The adaptive boost circuit 210 controls the boost voltage $V_{BOOST}$ according to the first and second input signals INP and INM. In an embodiment, the adaptive boost circuit 210 controls the boost voltage $V_{BOOST}$ according to an envelope of the first and second input signals INP and INM. In another embodiment, the adaptive boost circuit 210 controls the boost voltage $V_{BOOST}$ according to values of the digital audio signal DAIN.

The adaptive boost circuit 210 may control the boost voltage $V_{BOOST}$ to have a first voltage when a magnitude of the envelope of the first and second input signals INP and INM is less than a trigger value, and controls the boost voltage $V_{BOOST}$ to have a second voltage higher than the first voltage when the magnitude of the envelope is greater than or equal to the trigger value. The trigger value may be fixed, or may vary according to one or more of the battery voltage $V_{BAT}$, a volume control signal, and so on.

Figure 3:
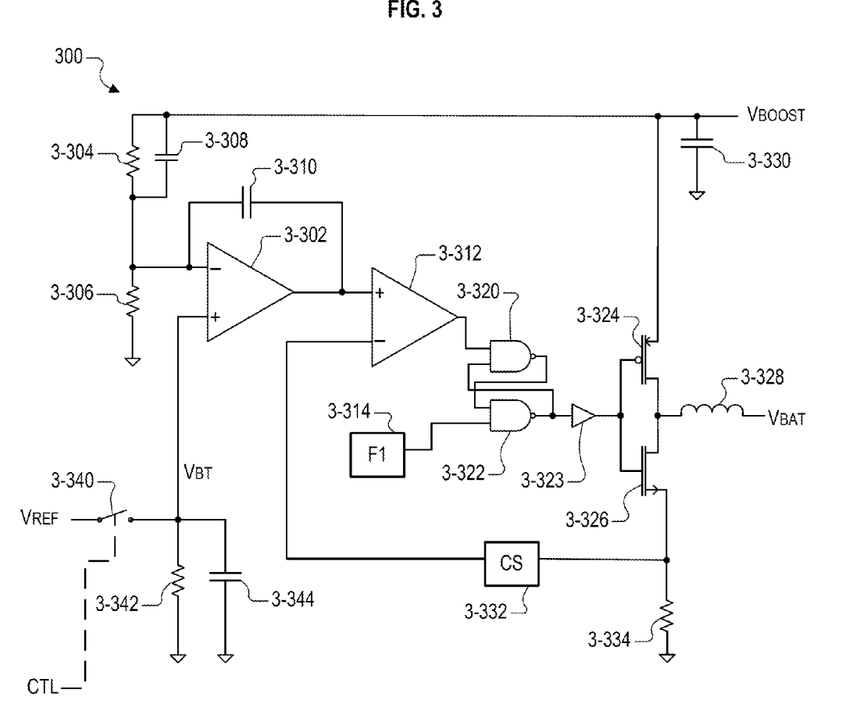
FIG. 3 is a circuit diagram of a boost circuit according to an embodiment.

FIG. 3 shows a boost circuit 300 suitable for use in the adaptive boost circuit 210 according to an embodiment. The boost circuit 300 is configured to supply either the battery voltage $V_{BAT}$ as the boost voltage $V_{BOOST}$ or to supply a voltage determined using a boost target voltage $V_{BT}$. The boost circuit 300 is configured to control the boost target voltage $V_{BT}$ so as to prevent abrupt transitions of the boost voltage $V_{BOOST}$ from a first voltage substantially higher than the battery voltage $V_{BAT}$ to a second voltage substantially equal to the battery voltage $V_{BAT}$.

The boost circuit 300 includes a differential amplifier 3-302. The differential amplifier 3-302 operates with a first capacitor 3-310 to act as an integrator, and integrates the difference between positive and negative inputs of the differential amplifier 3-302. Therefore, the output voltage of the differential amplifier 3-302 increases when the magnitude of a signal on the negative input is less than the magnitude of a signal on the positive input, and decreases when the magnitude of the signal on the negative input exceeds the magnitude of the signal on the positive input.

The positive input of the differential amplifier 3-302 is connected to the boost target voltage $V_{BT}$. The negative input of the differential amplifier 3-302 is connected to the output of a voltage divider formed by first and second resistors 3-304 and 3-306. The voltage divider operates to divide the boost voltage $V_{BOOST}$ by a scale value S=(R1+R2)/R2, where R1 and R2 are resistances of the first and second resistors 3-304 and 3-306, respectively. A fourth capacitor 3-308 is connected across the first resistor 3-304 to produce a proper transfer function of the differential amplifier 3-302.

When the boost voltage $V_{BOOST}$ is greater than the product of the scale value S and the boost target voltage $V_{BT}$, that is, when $V_{BOOST} > S \times V_{BT}$, the magnitude of the output of the first differential amplifier 3-302 decreases. When the boost voltage $V_{BOOST}$ is less than the product of the scale value S and the boost target voltage $V_{BT}$, that is, when $V_{BOOST} < S \times V_{BT}$, the magnitude of the output of the first differential amplifier 3-302 increases.

The output of the integrator formed by the differential amplifier 3-302 and the first capacitor 3-310 is coupled to a positive input of a comparator 3-312. A negative input of the comparator 3-312 is connected to an output of a current sense circuit 3-332. When the magnitude of the output of the integrator exceeds the magnitude of the output of the current sense circuit 3-332, the comparator 3-312 outputs a high (logic 1) value. Otherwise, the comparator 3-312 outputs a low (logical 0) value.

The output of the comparator 3-312 is connected to a first input of a latch formed by cross-coupled first and second NAND gates 3-320 and 3-322. A second input of the latch is connected to an oscillator 3-314. The oscillator 3-314 has an output signal that alternates between a high (logical 1) and a low (logical 0) value at a frequency.

When the output of the oscillator 3-314 connected to the second input of the latch has a low value, an output of the latch has a high (logical 1) value. When the output of the oscillator 3-314 connected to the second input has a high value and the output of the comparator 3-312 connected to the first input has a low value, the output of the latch has a low (logical 0) value. When the output of the comparator 3-312 and the output of the oscillator 3-314 both have a high value, the output of the latch retains its previous value.

The output of the latch formed by the first and second NAND gates 3-320 and 3-322 is connected to an input of a buffer 3-323. An output of the buffer 3-323 is connected to gates of a PMOS transistor 3-324 and an NMOS transistor 3-326. When the output of the latch has a low value, the output of the buffer 3-323 has a low value, the PMOS transistor 3-324 is turned on, and the NMOS transistor 3-326 is turned off. When the output of the latch has a high value, the output of the buffer 3-323 has a high value, the PMOS transistor 3-324 is turned off, and the NMOS transistor 3-326 is turned on. Drain terminals of the NMOS transistor 3-326 and PMOS transistor 3-324 are connected to a first terminal of an inductor 3-328. A second terminal of the inductor 3-328 is connected to the battery voltage $V_{BAT}$.

A source terminal of the NMOS transistor 3-326 is connected to a first terminal of a current sense resistor 3-334 and to an input of the current sense circuit 3-332. A second terminal of the current sense resistor 3-334 is connected to ground. A source terminal of the PMOS transistor 3-326 is connected to a first terminal of a second capacitor 3-330 and to the boost voltage $V_{BOOST}$. A second terminal of the second capacitor 3-330 is connected to ground.

When the NMOS transistor 3-326 is turned on, current from the battery voltage $V_{BAT}$ flows through the inductor 3-328 and energy is stored into the inductor 3-328. When the NMOS transistor 3-326 is turned off and the PMOS transistor 3-326 is turned on, current from the battery voltage $V_{BAT}$ and the energy, if any, stored in the inductor 3-328 may flow into the second capacitor 3-330, which causes an increase in the boost voltage $V_{BOOST}$.

A person of skill in the art in light of the teachings and disclosures herein would understand that by the operation of the above described devices, the boost circuit 300 produces a the boost voltage $V_{BOOST}$ equal to $V_{BT} \times (R1+R2)/R2$, where R1 and R2 are the resistances of the first and second resistors 3-304 and 3-306, respectively, when $V_{BAT} < V_{BT} \times (R1+R2)/R2$. When $V_{BAT} \geq V_{BT} \times (R1+R2)/R2$, the boost circuit 300 produces the boost voltage $V_{BOOST}$ equal to the battery voltage $V_{BAT}$.

The boost target voltage $V_{BT}$ is determined by the sub-circuit including a switching device 3-340, a third resistor 3-342, and a third capacitor 3-344. A first terminal of the switching device 3-340 receives a reference voltage $V_{REF}$. A second terminal of the of the switching device 3-340 is connected to a first terminal of the third resistor 3-342, a first terminal of the third capacitor 3-344, and the positive input of differential amplifier 3-302. Second terminals of the third resistor 3-342 and third capacitor 3-344 are connected to ground. The boost target voltage $V_{BT}$ is produced on the second terminal of the switching device 3-340.

A person of ordinary skill in the art in light of the disclosures herein would understand that the switching device 3-340, shown as a switch in FIG. 3, may be implemented using any of a number of switching technologies, including a transistor, a pass gate, and so on.

The switching device 3-340 is controlled by a control signal CTL. The control signal CTL has a first state when a boost voltage $V_{BOOST}$ having a higher magnitude is called for, and has a second state when boost voltage $V_{BOOST}$ having the higher magnitude is not called for.

When the control signal CTL has the first state, the switching device 3-340 is turned on (i.e. closed), and a voltage on the third capacitor 3-344 and the boost target voltage $V_{BT}$ are both equal to the reference voltage $V_{REF}$. As a result, the magnitude of the boost voltage $V_{BOOST}$ is controlled to be equal to $V_{REF} \times (R1+R2)/R2$. The reference voltage $V_{REF}$ and the resistances R1 and R2 of the first and second resistors 3-304 and 3-306 are selected so that $V_{REF} \times (R1+R2)/R2$ is greater than the battery voltage $V_{BAT}$.

When the control signal CTL has the second state, the switching device 3-340 is turned off (i.e. open), and the boost target voltage $V_{BT}$ decreases as the third capacitor 3-344 discharges through the third resistor 3-342. A first slope of the decline of the boost target voltage $V_{BT}$ is controlled by a time constant $T_{RC}$ equal to $C3 \times R3$, where C3 is a capacitance of the third capacitor 3-344 and R3 is a resistance of the third resistor 3-342. As a result, the boost voltage $V_{BOOST}$ declines from $V_{REF} \times (R1+R2)/R2$ to the battery voltage $V_{BAT}$, with the decline of the boost voltage $V_{BOOST}$ having a second slope controlled by the first slope.

Thus, when the switching device 3-340 is turned on, the boost target voltage $V_{BT}$ increases without substantial delay to the reference voltage $V_{REF}$ and the boost voltage $V_{BOOST}$ rapidly increases accordingly. When the switching device 3-340 is turned off, the boost target voltage $V_{BT}$ decreases according to the first slope and the boost voltage $V_{BOOST}$ therefore decreases according to the second slope, until the boost voltage $V_{BOOST}$ is equal to the battery voltage $V_{BAT}$.

In this manner, the boost circuit controls a slope of the decrease in the magnitude of the boost voltage $V_{BOOST}$ while still allowing the magnitude of the boost voltage $V_{BOOST}$ to be increased without substantial delay when the boost voltage $V_{BOOST}$ having the higher magnitude is called for.

Figure 4A:
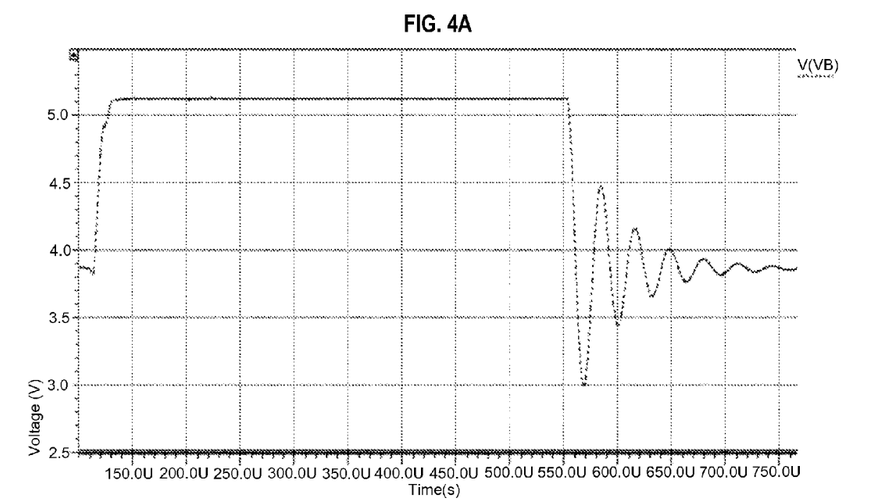
FIGS. 4A and 4B illustrate an operation of a conventional boost circuit and the boost circuit of FIG. 3, respectively.
Figure 4B:
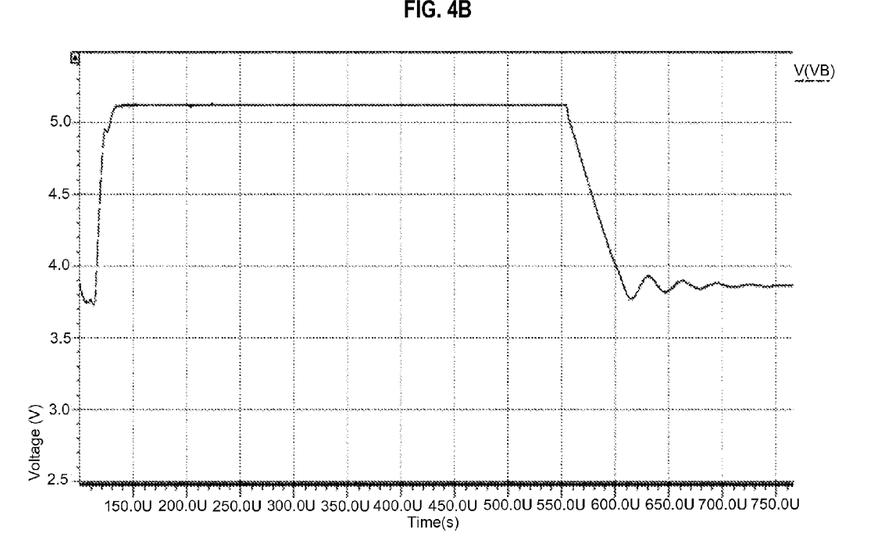

FIGS. 4A and 4B illustrate an operation of the boost circuit 300 of FIG. 3 as compared to a boost circuit of the related art. In particular, FIG. 4A shows a boost voltage V(VB) produced by a circuit of the related art. At a time of about 550 microseconds, a higher boost voltage is no longer called for, and the boost circuit of the related art switches off. A resonance between an energy storage inductor and an energy storage capacitor of the boost circuit causes the ringing in the boost voltage V(VB) shown in the period between 550 microseconds and 750 microseconds. This ringing in the boost voltage V(VB) may generate Electro-Magnetic Interference (EMI) and may introduce distortion into the output of an amplifier powered using the boost voltage V(VB). Furthermore, the most negative excursion of the ringing, to approximately 3.0V at approximately 568 microseconds, may cause an undervoltage protection circuit to trigger inappropriately, which may shut down or otherwise interfere with the operation of a device incorporating the boost circuit.

FIG. 4B shows the operation of the boost circuit 300 of FIG. 3, wherein a boost voltage V(VB) corresponds to the boost voltage $V_{BOOST}$ of FIG. 3. By controlling the slope of the reduction of the boost voltage V(VB) once the higher boost voltage V(VB) is no longer called for, the boost circuit 300 substantially reduces ringing in the boost voltage V(VB). As a result, EMI, distortion in the output of an amplifier powered using the boost voltage V(VB), and a likelihood that an undervoltage protection circuit is triggered inappropriately may be reduced.

Figure 5:
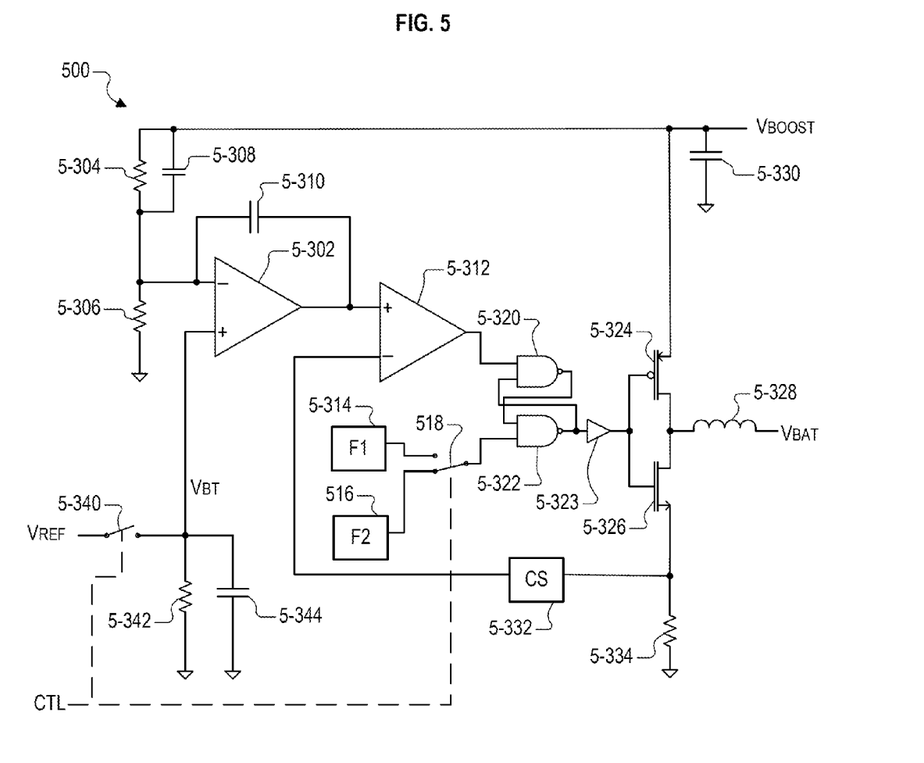
FIG. 5 is a circuit diagram of a boost circuit according to another embodiment.

FIG. 5 shows a boost circuit 500 suitable for use in the adaptive boost circuit 210 according to another embodiment. The boost circuit 500 differs from the boost circuit 300 of FIG. 3 by altering the switching frequency of the boost circuit when the higher boost voltage $V_{BOOST}$ is not called for.

The components of boost circuit 500 of FIG. 5 are similar to the similarly-numbered components of boost circuit 300 of FIG. 3, and are therefore not described in detail. In the boost circuit 500, a first switching device 5-340 corresponds to the switching device 3-340 of FIG. 3, a first oscillator 5-314 corresponds to the oscillator 3-314, and a second switching device 518 is connected between the first oscillator 5-314 and a second input of a latch formed by cross-coupled first and second NAND gates 5-320 and 5-322.

The second switching device 518 couples the second input of the latch to the first oscillator 5-314 when the second switching device 518 is in a first state, and couples the second input of the latch to a second oscillator 516 when the second switching device 518 is in a second state. A person of ordinary skill in the art in light of the disclosures herein would understand that the second switching device 518, shown as a single-pole double-throw switch in FIG. 5, may be implemented using any of a number of technologies, including transistors, multiplexers, pass gates, logic gates, and so on.

The switching device 518 is controlled by a control signal CTL to be in the first state when a higher boost voltage $V_{BOOST}$ is called for, and controlled by the control signal CTL to be in the second state when the higher boost voltage $V_{BOOST}$ is not called for. The second switching device 518 is in the first state when the first switching device 5-340 is turned on, and in the second state when the first switching device 5-340 is turned off.

The second oscillator 516 outputs a frequency substantially lower than a frequency output from the first oscillator 5-314. In an embodiment, the frequency output by of the second oscillator 516 is between one-eighth and one-tenth of the frequency output by the first oscillator 5-314. In an embodiment, the output of the second oscillator 516 is generated by frequency dividing the output of the first oscillator 5-314.

The PMOS transistor 5-324 and the NMOS transistor 5-326 are therefore operated using a first frequency when a higher boost voltage is called for, and operated using a second frequency when the higher boost voltage $V_{BOOST}$ is not called for, wherein the second frequency is substantially lower than the first frequency. By using a lower frequency when the higher voltage boost voltage $V_{BOOST}$ is not called for, the boost circuit 500 ensures that the boost voltage $V_{BOOST}$ decreases from the higher voltage.

Figure 6:
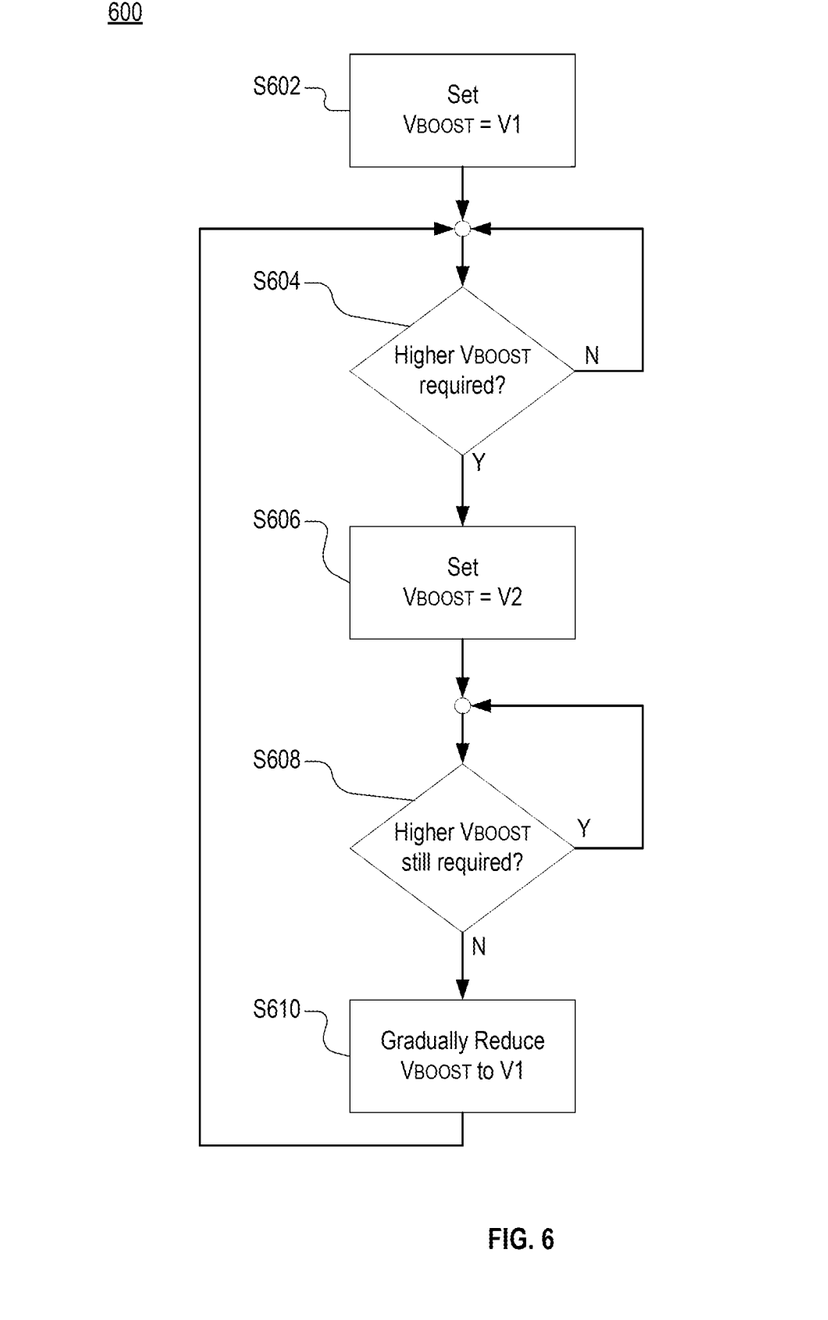
FIG. 6 is a flowchart of a process of controlling a boost voltage according to an embodiment.

FIG. 6 shows a process 600 of controlling a boost voltage according to an embodiment.

Initially, at S602, the boost voltage $V_{BOOST}$ is controlled to be equal to a first voltage V1. In an embodiment, the first voltage V1 is a battery voltage.

At S604, whether a higher boost voltage $V_{BOOST}$ is called for is determined.

When a higher boost voltage $V_{BOOST}$ is called for, at S606, the boost voltage $V_{BOOST}$ is controlled to be equal to a second voltage V2. The second voltage V2 is substantially higher than the first voltage V1. Controlling the boost voltage $V_{BOOST}$ to be equal to the second voltage V2 may include increasing a target voltage $V_{BT}$ and controlling the boost voltage $V_{BOOST}$ according to the target voltage $V_{BT}$. Controlling the boost voltage $V_{BOOST}$ to be the second voltage V2 may include operating a portion of the boost circuit at a first frequency.

At S608, whether a higher boost voltage $V_{BOOST}$ is still called for is determined.

When a higher boost voltage $V_{BOOST}$ is no longer called for, at S610, the boost voltage $V_{BOOST}$ is gradually reduced from the second voltage V2 to the first voltage V1. Gradually reducing the boost voltage $V_{BOOST}$ may include gradually reducing the target voltage $V_{BT}$ and controlling the boost voltage $V_{BOOST}$ according to the target voltage $V_{BT}$. Gradually reducing the boost voltage $V_{BOOST}$ may include operating the portion of the boost circuit at a second frequency substantially lower than the first frequency.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus, comprising:
a first circuit configured to:
  receive a control signal,
  generate a boost voltage having a magnitude equal to a first predetermined value in response to the control signal being in a first state, and
  generate the boost voltage having the magnitude equal to a second predetermined value in response to the control signal being in a second state; and
a second circuit configured to:
  control a slope of the magnitude of the boost voltage according to a first predetermined slope while the first circuit is reducing the magnitude of the boost voltage from the first predetermined value to the second predetermined value, and
  increase the magnitude of the boost voltage without substantial delay while the first circuit is increasing the magnitude of the boost voltage from the second predetermined value to the first predetermined value,
wherein the second predetermined value is substantially less than the first predetermined value.

2. The apparatus of claim 1, wherein the first circuit receives a power supply voltage having a magnitude substantially equal to the second predetermined value.

3. The apparatus of claim 1, wherein the first circuit comprises a transistor, and
  wherein the first circuit is configured to control the transistor using a first frequency when the control signal is in the first state, and to control the transistor using a second frequency instead of the first frequency when the control signal is in the second state, the first frequency being substantially higher than the second frequency.

4. The apparatus of claim 3, wherein the first frequency is eight to ten times higher than the second frequency.

5. The apparatus of claim 1, further including a class D amplifier, wherein the boost voltage is a supply voltage of the class D amplifier.

6. The apparatus of claim 1, wherein the apparatus is a semiconductor chip including an integrated circuit.

7. The apparatus of claim 1, wherein the apparatus reduces a magnitude of ringing in the boost voltage by controlling the slope of the magnitude of the boost voltage according to the first predetermined slope when the magnitude of the boost voltage is being decreased.

8. An apparatus, comprising:
a first circuit configured to generate a boost voltage; and
a second circuit configured to:
  control a slope of a magnitude of the boost voltage according to a first predetermined slope while the first circuit is reducing the magnitude of the boost voltage from a first predetermined value to a second predetermined value, and
  increase the magnitude of the boost voltage without substantial delay while the first circuit is increasing the magnitude of the boost voltage from the second predetermined value to the first predetermined value,
wherein the apparatus is configured to receive a control signal, and
wherein the second circuit comprises:
  a target voltage circuit configured to raise a target voltage to a first voltage without delay in response to the control signal being in a first state, and to reduce the target voltage to a second voltage while controlling a slope of a magnitude of the target voltage according to a second predetermined slope in response to the control signal changing from the first state to a second state,
wherein the first circuit is configured to determine the magnitude of the boost voltage using the target voltage so that the boost voltage is equal to the target voltage times a predetermined scale value, and
wherein the second voltage is substantially less than the first voltage.

9. The apparatus of claim 8, wherein the target voltage circuit includes:
a switching device having a first terminal coupled to a reference voltage;
a capacitor having a first terminal coupled to a second terminal of the switching device and a second terminal coupled to a ground; and
a resistor having a first terminal coupled to the second terminal of the switching device and a second terminal coupled to the ground,
wherein the target voltage is determined by a voltage on the second terminal of the switching device, and the switching device is closed when the control signal is in the first state and open when the control signal is in the second state.

10. A method of providing a boost voltage, the method comprising:
- receiving a control signal;
- providing the boost voltage equal to a first predetermined value in response to the control signal having a first state;
- providing the boost voltage equal to a second predetermined value in response to the control signal having a second state
- controlling a slope of a magnitude of the boost voltage according to a first predetermined slope while the magnitude of the boost voltage is being decreased from the first predetermined value to the second predetermined value; and
- increasing the magnitude of the boost voltage without substantial delay while the magnitude of the boost voltage is being increased from the second predetermined value to the first predetermined value,
- wherein the second predetermined value is substantially less than the first predetermined value.

11. The method of claim 10, wherein the boost voltage is provided by a boost circuit, the method further comprising:
- providing the boost voltage according to a target voltage; and
- controlling a slope of a magnitude of the target voltage according to a second predetermined slope while the magnitude of the target voltage is being reduced, wherein the magnitude of the boost voltage is equal to the magnitude of the target voltage times a predetermined scale value.

12. The method of claim 11, further comprising providing the boost voltage to a class D amplifier as a supply voltage.

13. The method of claim 10,
- wherein the boost voltage is provided by a boost circuit, and
- wherein the second predetermined value is substantially equal to a magnitude of a power supply voltage of the boost circuit.

14. The method of claim 10, wherein the boost voltage is provided by a boost circuit, the method further comprising:
- operating a portion of the boost circuit at a first frequency in response to the control signal being in the first state; and
- operating the portion of the boost circuit at a second frequency instead of the first frequency in response to the control signal being in the second state,
- wherein the first frequency is substantially higher than the second frequency.

15. The method of claim 14, wherein the first frequency is eight to ten times higher than the second frequency.

16. The method of claim 10, further comprising:
- reducing a magnitude of ringing in the boost voltage by controlling the slope of the magnitude of the boost voltage according to the first predetermined slope when the magnitude of the boost voltage is being decreased.

* * * * *